United States Patent [19]

Coley

[11] Patent Number: 4,861,990

[45] Date of Patent: Aug. 29, 1989

[54] TUNNELING SUSCEPTOMETRY

[75] Inventor: Terry R. Coley, Pasadena, Calif.

[73] Assignee: California Institute of Technology, Pasadena, Calif.

[21] Appl. No.: 154,084

[22] Filed: Feb. 9, 1988

[51] Int. Cl.$^4$ .............................................. H01J 37/00
[52] U.S. Cl. ..................................... 250/306; 324/201
[58] Field of Search ............. 324/201; 250/306, 423 F

[56] References Cited

U.S. PATENT DOCUMENTS 4,724,318  2/1988  Binnig ................................. 250/306

OTHER PUBLICATIONS

Russell Young, John Ward, and Fredric Scire, *The Topografiner: An Instrument for Measuring Surface Microtopography*, Rev. Sci. Instrum., 1972, 43, 999.

G. Binnig, H. Rohrer, Ch. Gerber, and E. Weibel, *Tunneling Through a Controllable Vacuum Gap*, Appl. Phys. Lett., 1982, 40, 178.

Drs. G. Binnig, C. F. Quate and Ch. Gerber, *Atomic Force Microscope*, Phys. Rev. Lett., 1986, 56, 930.

G. Binnig, H. Rohrer, Ch. Gerber and E. Weibel, *Surface Studies by Scanning Tunneling Microscopy*, Phys. Rev. Lett., 1982, 49, 57, of IBM Zurich Research Laboratory.

U. Dürig, J. K. Gimzewski and D. W. Phol, *Experimental Observation of Forces Acting During Scanning Tunneling Microscopy*, Phy. Rev. Lett., 1986, 57, 2403.

Gary M. McClelland, Ragnar Erlandsson and Shirley Chiang, *Atomic Force Microscopy: General Principles and a New Implementaion*, accepted for publication in Review of Progress in Quantitative Non-Destructive Evaluation, vol. 6, Plenum, NY (1987).

Ch. Gerber, B. Binnig, H. Fuchs, O. Marti and H. Rohrer, *Scanning Tunneling Microscope Combined With a Scanning Electron Microscope*, Rec. Sci. Instrum., 1986, 57, 221.

G. Binnig and H. Rohrer, *Scanning Tunneling Microscopy*, Helvetica Physica Acta, vol. 55 (1982) 726–735.

Calvin F. Quate, *Vacuum Tunneling: A New Technique for Microscopy*, Phys. Today (Aug. 1986) 26–33.

W. J. Kaiser and R. C. Jaklevic, *Scanning Tunneling Microscopy Study of Metals; Spectroscopy and Topography*, Surf. Sci. 181, 55 (1987).

Robert E. Benfield, Peter P. Edwards and Angelica M. Stacy, *Paramagnetism in High–Nuclearity Osmium Clusters*, J. Chem. Soc., Chem. Commun., 1982, 10, 525.

B. J. Pronk, H. B. Brom, L. J. de Jongh, G. Longoni and A. Ceriotti, *Physical Properties of Metal Cluster Compounds I: Magnetic Measurements on High–Nuclearity Nickel and Platinum Carbonyl Clusters*, Solid State Commun., 1986, 59, 349.

R. G. Chambers, *The De Hass–Van Alphen Effect*, Canadian J. Phys., 1956, 34, 1395, at 1407 et seq.

R. Meservey and J. S. Moodera, *Performance of a Magnetic Susceptometer for Thin Films and Surfaces*, J. Appl. Phys., 1986, 60, 3007.

S. Vitale, S. Morante, and M. Cerdonio, *Superconducting Susceptometer for High–Accuracy Routine Operation*, Rev. Sci. Instrum., 1982, 53, 1123.

G. Binnig and D. P. E. Smith, *Single–Tube Three–Dimensional Scanner for Tunneling Microscopy*, Rev. Sci, Instrum., Aug. 1986, 57, 1688.

"High–Stability Bimorph Scanning Tunneling Microscope", Blackford et al., *Rev. Sci. Ins.* 58 (8), Aug. 1987, pp. 1343–1347.

*Primary Examiner*—Bruce C. Anderson
*Attorney, Agent, or Firm*—Benoit Law Corporation

[57] ABSTRACT

Methods and apparatus for determining susceptibility of a material to a field, such as magnetic susceptibility, provide an elastic support for a sample of that material, and an electric tunneling current through a gap between an electrode and that elastic support. That gap is varied with a magnetic or other field applied to the sample on the elastic support to effect corresponding tunneling current variations or variations in an electrical property of the gap. Magnetic susceptibility of the sample, or other susceptibility of the sample to the applied field, is determined in response to these variations.

56 Claims, 5 Drawing Sheets

TUNNELING SUSCEPTOMETRY

BACKGROUND OF THE INVENTION

1. Field of the Invention

The subject invention relates to tunneling susceptometry, which includes determination of magnetic susceptibility or, broadly, of susceptibility of a material to a field, with the aid of electric tunneling current, and also relates to methods and apparatus for enabling or effecting such susceptibility determinations or investigations.

2. Information Disclosure Statement

The following disclosure statement is made pursuant to the duty of disclosure imposed by law and formulated in 37 CFR 1.56(a). No representation is hereby made that information thus disclosed in fact constitutes prior art, inasmuch as 37 CFR 1.56(a) relies on a materiality concept which depends on uncertain and inevitably subjective elements of substantial likelihood and reasonableness and inasmuch as a growing attitude appears to require citation of material which might lead to a discovery of pertinent material though not necessarily being of itself pertinent. Also, the following comments contain conclusions and observations which have only been drawn or become apparent after conception of the subject invention or which contrast the subject invention or its merits against the background of developments which may be subsequent in time or priority.

The subject invention should be distinguished from Scanning Tunneling Microscopy (STM), even though embodiments thereof may in part use similar instrumentation. STM sprang from efforts to characterize the topography of surfaces at the atomic level, manifesting themselves initially in the so-called "topografiner" developed by Russell Young, John Ward and Fredric Scire, as apparent from their article entitled *The Topografiner: An Instrument for Measuring Surface Microtopography*, Rev. Sci. Instrum., 1972, 43, 999. The topografiner produced real space images of irregular surfaces. Since the topografiner achieved lateral resolutions on the order of 4000 Å and surface normal resolutions of 30–40 Å, it was a notable development of the past six years when Binnig et al. overcame various stability problems and demonstrated the first scanning tunneling microscope which achieved lateral resolutions on the order of tens of angstroms, with angstrom resolution normal to the surface. Early STM designs went to great lengths to achieve tunneling gap stability. As apparent from their article entitled *Tunneling Through A Controllable Vacuum Gap*, G. Binnig, H. Rohrer, Ch. Gerber, and E. Weibel, Appl. Phys. Lett., 1982, 40, 178, demonstrated tunneling from a W tip to a Pt surface with an STM in a vacuum chamber on a stone bench "floating" on inflated rubber tubes. Internal vibrations were filtered out by magnetic levitation over a superconducting bowl of Pb which was superinsulated and cooled directly by liquid He. Subsequently, tunneling current has been demonstrated with less elaborate STM units. The key is structural rigidity of the tip-sample connection which forces any external vibrations to move tip and sample identically and simultaneously. There now are STM's with lateral resolutions of less than 5 Å and normal resolutions of hundredths of angstroms for certain surfaces.

In an article entitled *Atomic Force Microscope*, Phys. Rev. Lett., 1986, 56, 930, Drs. G. Binnig, C. F. Quate and Ch. Gerber proposed measurement of ultrasmall forces on particles as small as single atoms by monitoring the elastic deformation of various types of springs with their scanning tunneling microscope. By way of background, they pointed out that it has been a common practice to use the displacement of springs as a measure of force, and that previous methods have relied on electrostatic fields, magnetostatic fields, optical waves, and x-rays. They also commented that SQUIDs are superconducting elements that measure the expulsion of magnetic fields in variable-inductance devices, and that have been used in gravity gradiometers to measure displacements of $10^{-6}$ Å. Others in their work with van der Waals forces have used optical interference methods to measure displacements of 1 Å. Their effort similarly was concerned with penetrating the regime of interatomic forces between single atoms and they proposed their atomic force microscope (AFM) as a new tool designed to exploit that level of sensitivity, enabling surface investigation of both conductors and insulators on an atomic scale. They envisioned a general-purpose device that will measure any type of force; not only the interatomic forces, but electromagnetic forces as well. However, the atomic force microscope actually disclosed in that article is a combination of the principles of the scanning tunneling microscope and the stylus profilometer.

In their proposed first mode, they modulated the sample in the z-direction at its resonant frequency (5.8 kHz); that is, in the direction of tunneling current flow. The force between the sample and the diamond stylus-the small force that they want to measure-deflects the lever holding the stylus. In turn, this modulates the tunneling current which is used to control the AFM-feedback circuit and maintain the force $f_o$ at a constant level.

In their second and third modes, the lever carrying the diamond stylus is driven at its resonant frequency in the z-direction with an amplitude of 0.1 to 10 Å. The force, $f_o$, between sample and stylus changes the resonant frequency of the lever. This changes both the amplitude and phase of the ac modulation of the tunneling current. Either of these can be used as a signal to drive the feedback circuits.

In the fourth mode they used one feedback circuit. It was connected to the AFM and it was controlled by the tunneling current in the STM. This system maintained the tunneling gap at a constant level by changing the force on the stylus.

The fourth mode was further improved by reconnection of both feedback circuits in such a way that the AFM sample and the STM tip were driven in opposite directions with a factor $\alpha$ less in amplitude for the STM tip. The value of $\alpha$ ranged from 10 to 1000.

In contrast to previous methods, the absolute value of $f_o$, the force on the stylus, was not well defined except at the beginning of the measurement, even in the absence of thermal drifts. However, they saw the limiting sensitivity of their instrument as far less than interatomic forces ranging from ionic bonds to van der Waals bonds and down to perhaps $10^{-12}$ N for some of the weaker forces of surface reconstruction. Their AFM, therefore, should be able to measure all of the important forces that exist between the sample and ad atoms on the stylus.

They further pointed out that these forces also exist in the tunneling microscope itself and that they can have a strong influence on the data collected with the STM.

Accordingly, they mentioned that the STM could be used as a force microscope in the mode they described by simply mounting the STM tip on a cantilever beam.

Further background materials include another article by G. Binnig, H. Rohrer, Ch. Gerber and E. Weibel, of the IBM Zurich Research Laboratory, entitled *Surface Studies By Scanning Tunneling Microscopy*, Phys. Rev. Lett., 1982, 49, 57, an article by U. Dürig, J. K. Gimzewski and D. W. Phol, entitled *Experimental Observation of Forces Acting During Scanning Tunneling Microscopy*, Phys. Rev. Lett., 1986, 57, 2403, and another article on atomic force microscopy by Gary M. McClelland, Ragnar Erlandsson and Shirley Chiang, entitled *Atomic Force Microscopy: General Principles and a New Implementation*, accepted for publication in Review of Progress in Quantitative Non-Destructive Evaluation, vol. 6, Plenum, New York (1987).

An intersecting design is apparent from an article by Ch. Gerber, G. Binnig, H. Fuchs, O. Marti and H. Rohrer, entitled *Scanning Tunneling Microscope Combined with a Scanning Electron Microscope*, Rev. Sci. Instrum., 1986, 57, 221, disclosing their "Pocket-Size" STM needing very little external vibration isolation.

Scanning tunneling microscopy also has been described in an article thus entitled by G. Binnig and H. Rohrer, published in Helvetica Physica Acta, vol. 55 (1982) 726–735.

In 1986, Drs. Binnig and Rohrer received the Nobel Prize in physics for their above mentioned work.

An overview has been published by Calvin F. Quate under the title of *Vacuum tunneling: A new technique for microscopy*, Phys. Today (Aug. 1986) 26–33, mentioning *inter alia* topography, surface state studies, surface charge density measurements, catalytic reaction studies, and material deposition as present or prospective fields of application.

A so-called "tube scanner" has been disclosed by G. Binnig and D. P. E. Smith in an article entitled *Single-tube Three-dimensional Scanner for Scanning Tunneling Microscopy*, Rev. Sci. Instrum., Aug. 1986, 57, 1688.

An advanced scanning tunneling microscope has been disclosed by W. J. Kaiser and R. C. Jaklevic, in *Scanning Tunneling Microscopy Study of Metals: Spectroscopy and Topography*, Surf. Sci. 181, 55 (1987). That Scanning Tunneling Microscope system was operated in several environments for both topographic imaging and tunnel spectroscopy. It shows high resistance to the effects of vibration and thermal drift. The device is unique in its simplicity and has only four moving parts. In addition, the critical tip-sample approach mechanism is inherently reliable and precise. That STM system accommodates a wide range of sample geometries and requires no special sample holder.

In a different vein, measurement of magnetic susceptibility has become increasingly important. Reference may in this respect be had to an article by Robert E. Benfield, Peter P. Edwards and Angelica M. Stacy, entitled *Paramagnetism in High-nuclearity Osmium Clusters*, J. Chem. Soc., Chem. Commun., 1982, 10, 525, mentioning a Faraday apparatus for measurement of magnetic susceptibility, and to an article by B. J. Pronk, H. B. Brom, L. J. de Jongh, G. Longoni and A. Ceriotti, entitled *Physical Properties of Metal Cluster Compounds I: Magnetic Measurements on High-Nuclearity Nickel and Platinum Carbonyl Clusters*, Solid State Commun., 1986, 59, 349, mentioning use of either a sensitive pendulum magnetometer or a vibrating sample magnetometer with a 6 T superconductive magnet for magnetic susceptibility measurement.

Changes in magnetic susceptibility with changing magnetic field strength have also been measured, such as by means of the de Haas - van Alphen effect exploring the Fermi surface of a sample, as mentioned by R. G. Chambers, in Canadian J. Phys., 1956, 34, 1395, at 1407 et seq.

A magnetic susceptometer for thin films and surfaces capable of detecting the effect of $10^{-6}$ atomic layers of Fe on a superconducting Pb substrate has been described by R. Maservey and J. S. Moodera, in an article entitled *Performance of a Magnetic Susceptometer for Thin Films and Surfaces*, J. Appl. Phys., 1986, 60, 3007. That method relies on measurements of the change in inductance of a 1000 Å thick superconducting Nb meander line. The sample to be measured is evaporated onto the insulator encapsulating the Nb meander line, which is the inductive element of a resonant circuit including a capacitor and being driven by a tunnel diode circuit. Changes in resonant frequency are indicated by a counter and plotted as a function of film thickness as measured by a quartz thickness gauge.

A clear advantage of that system is its ability to measure surface adsorbate susceptibilities with extreme sensitivity. However, the system can only be operated at superconducting temperatures. The geometry is restricted, in that orientation effects are at least difficult to study. Substrate choice is limited to substances which can be evaporated on the insulator surface, at least in the setup disclosed in that article.

A Superconducting Quantum Interference Device (SQUID) has been described by S. Vitale, S. Morante and M. Cerdonio, in an article entitled *Superconducting Susceptometer for High-Accuracy Routine Operation*, Rev. Sci. Instrum., 1982, 53, 1123.

SUMMARY OF THE INVENTION

It is an object of this invention to provide improved methods and apparatus for determining susceptibility of materials to fields exerting forces through space.

It is a germane object of this invention to overcome the above mentioned and other problems and complexities of prior-art magnetic susceptometers and susceptometry measurements.

It is a related object of this invention to provide new uses for and new combinations including tunneling microscopes and atomic force microscopes.

It is also an object of this invention to provide new techniques for materials research and investigation.

It is also an object of this invention to provide new susceptibility measurement techniques.

Other objects of the invention will become apparent in the further course of this disclosure.

From a first aspect thereof, the invention resides in a method of determining susceptibility of a material to a field exerting a force through space, comprising, in combination, the steps of providing a sample of the material on an elastic support, providing an electric tunneling current through a gap between an electrode and the elastic support, varying the gap with a force of the field applied to the sample on the elastic support to effect a corresponding variation in an electrical property of said gap, and determining susceptibility of the sample to the field in response to variation in said electrical property, such as by measurement of that variation in combination with the physical properties or the elastic support.

From a more specific aspect thereof, the invention resides in a method of determining magnetic susceptibility at a surface of a sample, comprising, in combination, the steps of providing the sample on an elastic support, providing an electric tunneling current through a gap between an electrode and the elastic support varying the gap with a magnetic field applied to the surface and sample on the elastic support to effect a corresponding variation in an electrical property of said gap, and determining magnetic susceptibility of the sample in response to said variation in said electrical property.

From a related aspect thereof, the invention resides in apparatus for determining susceptibility of a material to a field, such as a magnetic field or an electric field exerting a force through space, and more specifically, resides in the improvement comprising, in combination, an elastic support for a sample of that material, means including an electrode for providing an electric tunneling current through a gap between that electrode and said elastic support, and means for enabling determination of magnetic or other susceptibility of the sample in response to variations of an electrical property of said gap, including means for varying said gap with a magnetic or other field applied to the sample on the elastic support to effect corresponding variations of said electrical property.

Other aspects will become apparent in the further course of this disclosure, and no restriction to any object or aspects is intended by this Summary of the Invention.

BRIEF DESCRIPTION OF THE DRAWINGS

The subject invention and its various objects and aspects will become more readily apparent from the following detailed description of preferred embodiments thereof, illustrated by way of example in the accompanying drawings, in which like reference numerals designate like or equivalent parts, and in which.

DESCRIPTION OF PREFERRED EMBODIMENTS

Figure 1:
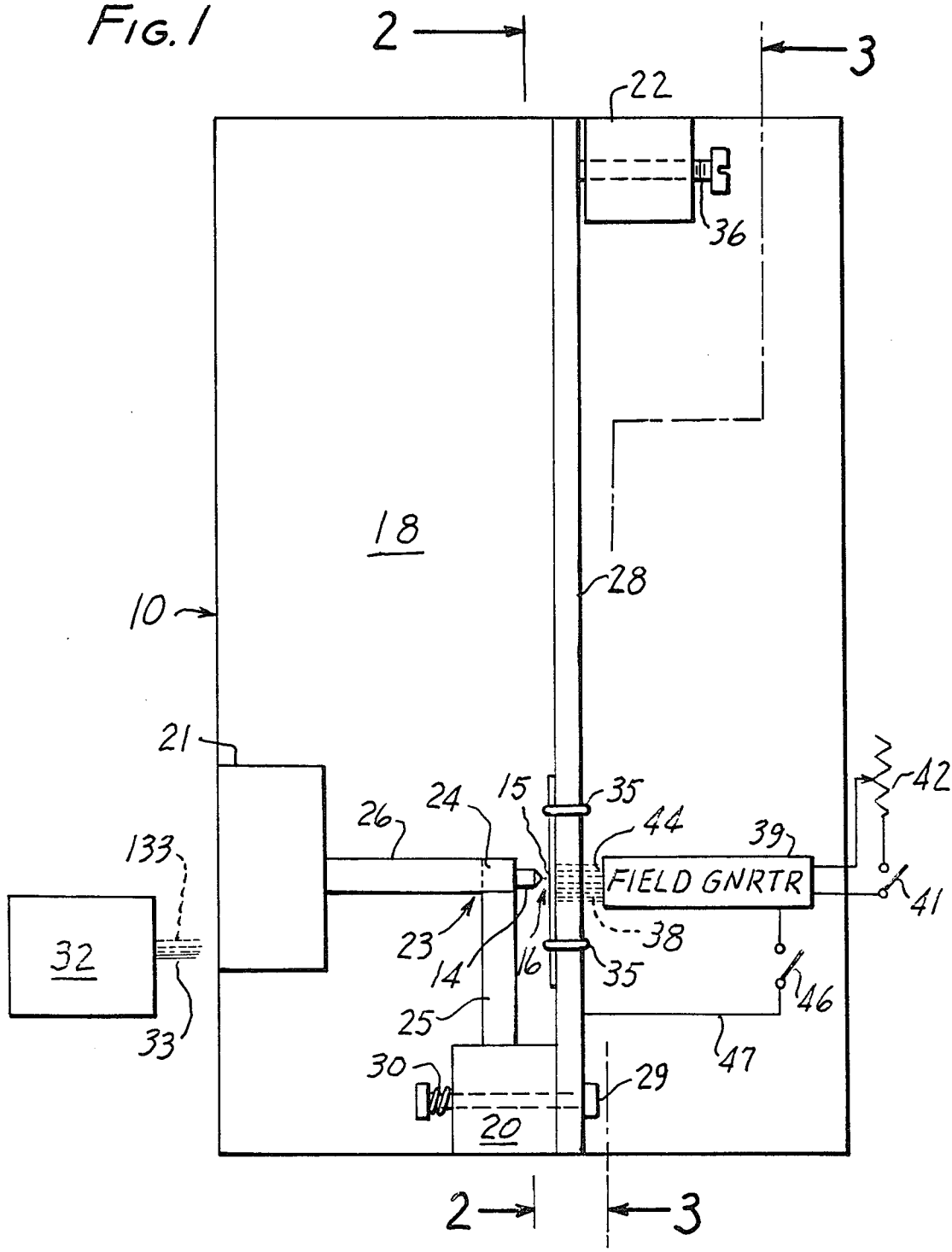
FIG. 1 is a plan view of a susceptibility determining apparatus according to an embodiment of the subject invention.

The drawings show apparatus 10 for determining magnetic susceptibility at a surface of a sample 12, or for making other measurements or determinations, as more fully disclosed below.

The apparatus 10 includes or provides an elastic support 13 for the sample 12. The apparatus 10 also has means including a tip or electrode 14 for providing an electric tunneling current 15 through a gap 16 between that tip or electrode and the elastic support or sample 13 or 12.

The apparatus 10 as shown has a base 18 with posts or uprights 20, 21 and 22 arising therefrom and being preferably cut from one block.

The apparatus 10 also includes what has been called a "piezotripod" 23 (see the above mentioned Gerber et al. 1986 *Rev. Sci. Instrum.* article).

The piezotripod has piezoceramic legs 24, 25 and 26 for the x, y and z directions of adjustment of the tip 14. These legs extend between or are supported by the base 18 and posts 20 and 21, respectively.

In particular, the piezoceramic legs 24, 25 and 26 extend at right angles to each other to form the piezotripod 23 or tunneling tip drive for fine positioning of the tip 14 relative to the sample 12. The tunneling tip 14 as shown is carried by or attached to the ends of the piezoceramic legs 24, 25 and 26 remotely from the base 18 and posts 20 to 22.

A coarse adjustment lever 28 is hinged on the post 20 with a pin 29. As shown by the phantom outline 128 in FIG. 3, the lever 28 may be swung upwardly in the direction of an arrow 31, so as to place the elastic support 13 in front of a sample deposition apparatus 32. The lever may, for instance, be made of quartz or other high resonance frequency material, and its mounting pin 29 may be springloaded, such as shown at 30, to prevent breakage of the lever.

The apparatus 32 may be conventional and may, for instance, project a molecular beam for surface deposition of the sample 12. Other examples for providing the sample are mentioned below.

In FIG. 1 the apparatus 32 is shown shifted sideways of the lever 28 or elastic support 13, and a molecular beam or other sample deposition agency is illustrated at 33.

The elastic support 13 as shown is part of a sample carrier 34, which, for instance, may be cut from gold or stainless steel foil, and which may have its bulk portion attached to a side of the lever 28, with the elastic support 13 depending or projecting therefrom. By way of example, two spring clips 35 are shown for attaching the sample carrier 34 to the beam 28.

Coarse adjustment as shown is provided at the post 22, such as by a screw 36 bearing against a free end of the hinged lever 28. Even for such coarse adjustment of the sample 12 relative to the tip 14, the screw 36 should be of the finest threading available. Such adjustment may be computer controlled via gears and a stepper motor (not shown).

Means for enabling determination of magnetic susceptibility of the sample 12 include means for varying the gap 16 with a magnetic field 38 applied to the surface and sample 12 on the elastic support 13 to effect corresponding tunneling current variations. A coil or other magnet 39 may be employed and may be mounted on or carried by the base 18 for that purpose.

As indicated by a switch 41, the magnet or other field generator 39 may be electrically energized and switched on and off to provide and to discontinue the field 38, respectively. By way of example, the switch 41 may be closed to subject the sample 12 to a magnetic field 38 in the presence of the tunneling current 15. A variable resistor 42 is shown in series with the switch 41 as representative of means for subjecting the applied magnetic field 38 to variation, thereby varying, for instance, the gap 16 and the tunneling current 15. In practice, electronic circuitry may, of course, be provided to perform the functions of components 41, 42 and 46.

Alternatively, the switch 41 may be closed and the field 38 generated before the electric tunneling current occurs. By way of example, if the sample 12 includes magnetizable material, such material may be magnetized with the field 38, which may then be terminated, such as by opening the switch 41, before the tunneling current 15 is provided.

Behavior of the sample with and without magnetization or as a function of remanent magnetization may thus be studied with the aid of electric tunneling current.

The operation of the subject invention may extend to different kind of fields. For instance, in addition to, or alternative of, the magnetic field already mentioned, the field 38, within the scope of the subject invention, may be an electrostatic field. In other words, the component 39 may be a magnetic or an electric field generator.

Various electrostatic or other electric field generators are well known. A simple expedient within the scope of the invention is to provide a first electrode 44 and to use or provide the elastic support 13 of the sample as the second electrode. In that case, the field generator 39 would apply an electric potential to these electrodes upon closure of a further switch 46 which connects the sample support via a lead 47 to one pole of the field generator 39, with the other pole being connected to the first electrode 44 thereof, so as to provide the electric field 38 at the sample 12. Alternatively, the sample 12 may be immersed in an electric field by locating such sample and its support 13 between electrode 44 and a further electrode (not shown) connected, for instance, to the lead 47 of the field generator.

Properties and behavior of samples under the influence of electric fields may thus be studied in addition to, or alternative of, their behavior in the presence of magnetic fields or upon magnetization.

In principle, conventional circuitry may be employed for driving the tip 14 and for maintaining and evaluating the tunneling current 15. A first generation of such circuitry was already shown by Young, Ward and Scire for their Topografiner, in their FIG. 4 for tunneling gap variation and X-Y scanning, and in their FIG. 5 for their constant power supply for the tunneling current. From that progenitor, and from different fields of application, various circuits, electronic tip positioning systems and tunneling current power supplies have developed over the years and have become well known.

Figure 4:
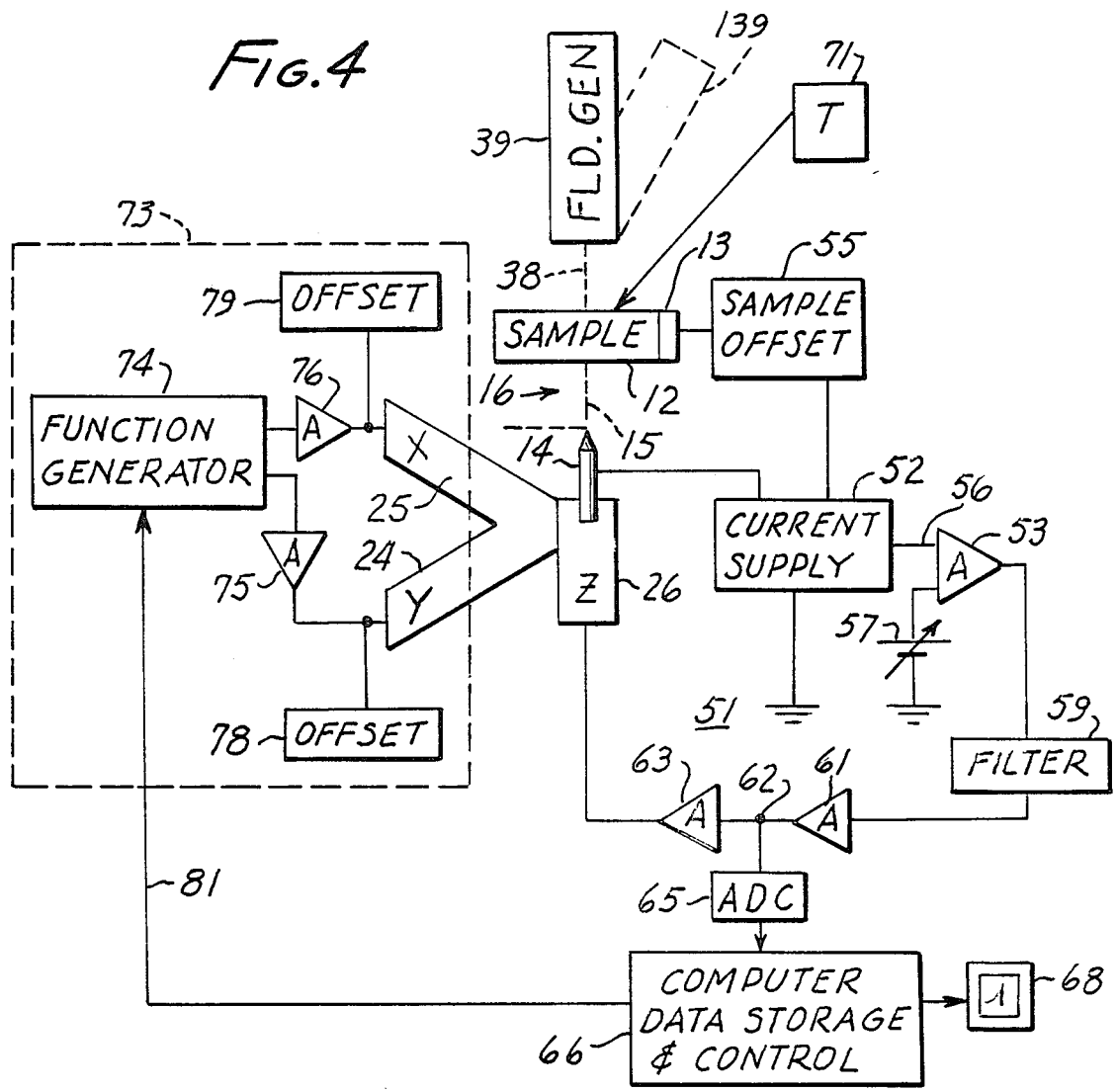
FIG. 4 is a block diagram of apparatus for controlling tunneling tip positioning and scanning and for effecting susceptibility and other determinations and indications.

Accordingly, while FIG. 4 illustrates certain circuitry of the type shown in the above mentioned Kaiser and Jaklevic article, such showing is not intended to preclude employment of any other system, as desired, or development of yet further systems for the practice of any aspect of the subject invention.

Within the scope of the invention, the tunneling current 15 could be supplied by a constant voltage source or by a constant current supply. In the former case, current would be sensed, while in the latter case voltage is sensed, for tunneling gap adjustment and measurement purposes. Of course, in order to avoid the appearance of a contradiction in the case of a constant current source, it has to be recalled that the expression "current" not only denotes the rate of flow of electricity, such as in the case of the constant current, I, but also connotes electric energy, such as in the case of the tunneling current 15. For instance, if the gap 16 is varied while the rate of flow of electric energy to that gap is maintained constant by the source 52, then there still is a corresponding variation in the tunneling current 15, which manifests itself in a change in voltage drop across the gap 16 and a corresponding change in the voltage drop seen by the differential amplifier input 56. Of course, if the source 52 were a constant voltage source, then there would be an actual change in the rate of current flow as well, when the gap 16 is varied. These and other alternatives within the scope of the subject invention may be summarized by saying that an electrical property of the gap or its variation of that electrical property in response to a variation in that gap 16 is sensed and is employed to determine magnetic susceptibility or the susceptibility of the sample 12 to another field or agency causing that gap variation; but expressions such as "tunneling current variation" are herein used interchangeably with expressions denoting change in electrical property of the gap.

According to the preferred embodiment shown in FIG. 4, a servo loop 51 is provided for the tunneling current 15. That loop includes a constant current supply 52, which may be of a conventional type, providing an input of a differential amplifier 53 with a voltage that varies in proportion to the function of the current supply in maintaining the tunneling current 15 constant. A sample offset 55 is provided between the constant current supply 52 and the elastic support 13 on which the sample 12 has been provided, as mentioned above. The sample offset 55 comprises or operates as an adjustable voltage source for offsetting a sample and tip Fermi level in a conventional manner.

As the force of the field 38 applied to the sample 12 on the elastic support 13 varies the gap 16 to effect corresponding tunneling current variations, the constant current supply 52, as its name implies, makes up for such variation by varying the voltage at the differential amplifier input 56 correspondingly. The differential amplifier 53 compares such varied or adjusted voltage to a reference voltage provided by an adjustable source 57 and supplies a corresponding output through a filter 59 to a variable gain operational amplifier 61. The filter 59 may be employed to remove noise and undesired frequencies and even may be provided with an RC or other time delay component, if hunting of the servo loop should be a problem or if a certain stabilization were to be provided.

Further stabilization of feedback through the loop is afforded by the variable gain of the operational amplifier 61, which supplies its output signal through a junction 62 to a high voltage operational amplifier 63 which, in turn, drives the piezo leg 26 in a conventional manner, thereby driving the tip 14 and adjusting the gap 16 accordingly, relative to the sample 12 or elastic support 13.

The output of the variable gain amplifier 61 is also applied via junction 62 and an analog to digital converter 65 as a signal to a computer and data storage 66. Such tunneling current loop signal may be rendered visible or otherwise discernible. Accordingly, a component 68 connected to the computer and data storage 66 is representative of a data recorder, X-Y plotter, oscilloscope, oscillograph or any other instrument aiding in a determination of the susceptibility of the sample 12 to the field 38 in response to tunneling current variations.

The subject invention, in this manner or otherwise within its scope, opens up and provides researchers, scientific investigators and other persons with a large and undoubtedly continually expanding numbers of useful methods, as well as with effective research, development and investigative tools.

Mentioning just some representative examples, the sample 12 may be deposited as a thin film sample on the elastic support 13, such as with the apparatus 32 or material deposition 33. The field generator 39 may apply an electric or magnetic field 38 to that thin film sample to effect corresponding tunneling current variations, and the loop 51 with apparatus 66 and 68 may then be employed to determine susceptibility of that thin film sample to the field 38 in response to the latter tunneling current variations.

As mentioned above, the applied field 38 may be subjected to variation, thereby varying the gap 16 and tunneling current 15 via the sample, and a change in susceptibility of that sample 12 may be determined as a function of that field variation with the varying tunneling current 15.

Figure 2:
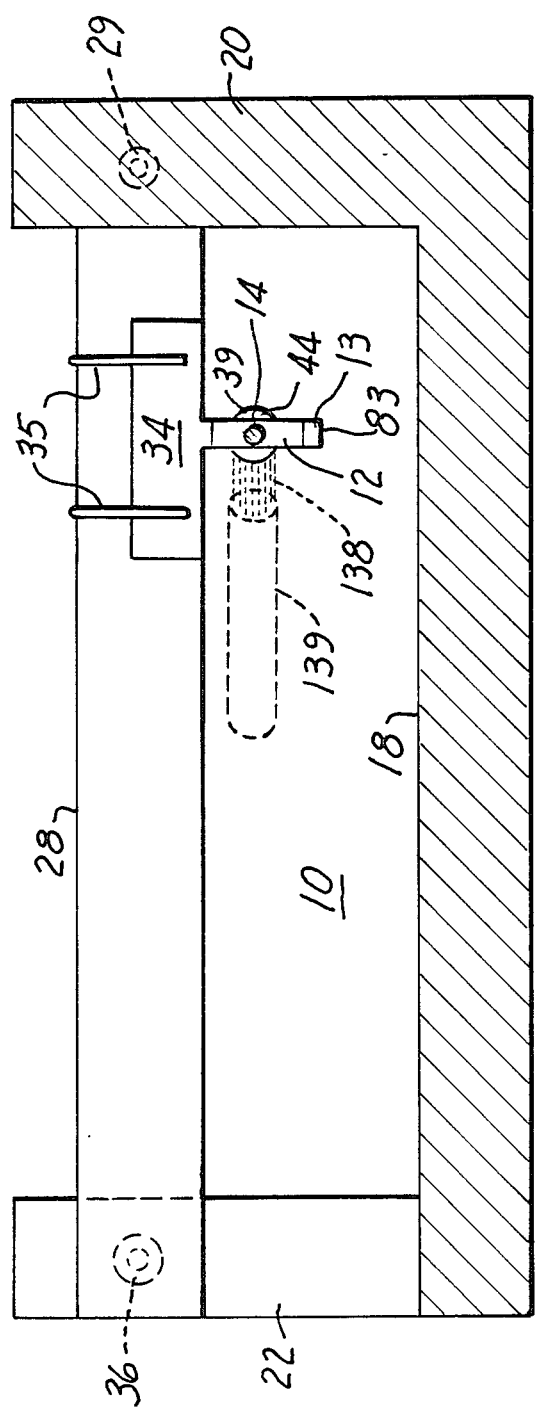
FIG. 2 is a view taken on the line 2—2 in FIG. 1.

As indicated at 139 in FIGS. 2 and 4, orientation of the field 38 may be subjected to variation. In this or another manner, susceptibility as a function of field orientation may be determined by applying the field 38 to the sample 12 at different orientations to its surface, for variation of the gap 16 and corresponding individual tunneling current variation at each field orientation. Anisotropies in susceptibility may thus be detected and, if desired, graphically displayed at 68.

As another example of utility, the sample 12 may be subjected to temperature variation to vary tunneling current through the gap 15. FIG. 4 shows a block 71 as representative of an oven or other means for subjecting the sample 12 to any desired temperature variation.

Figure 3:
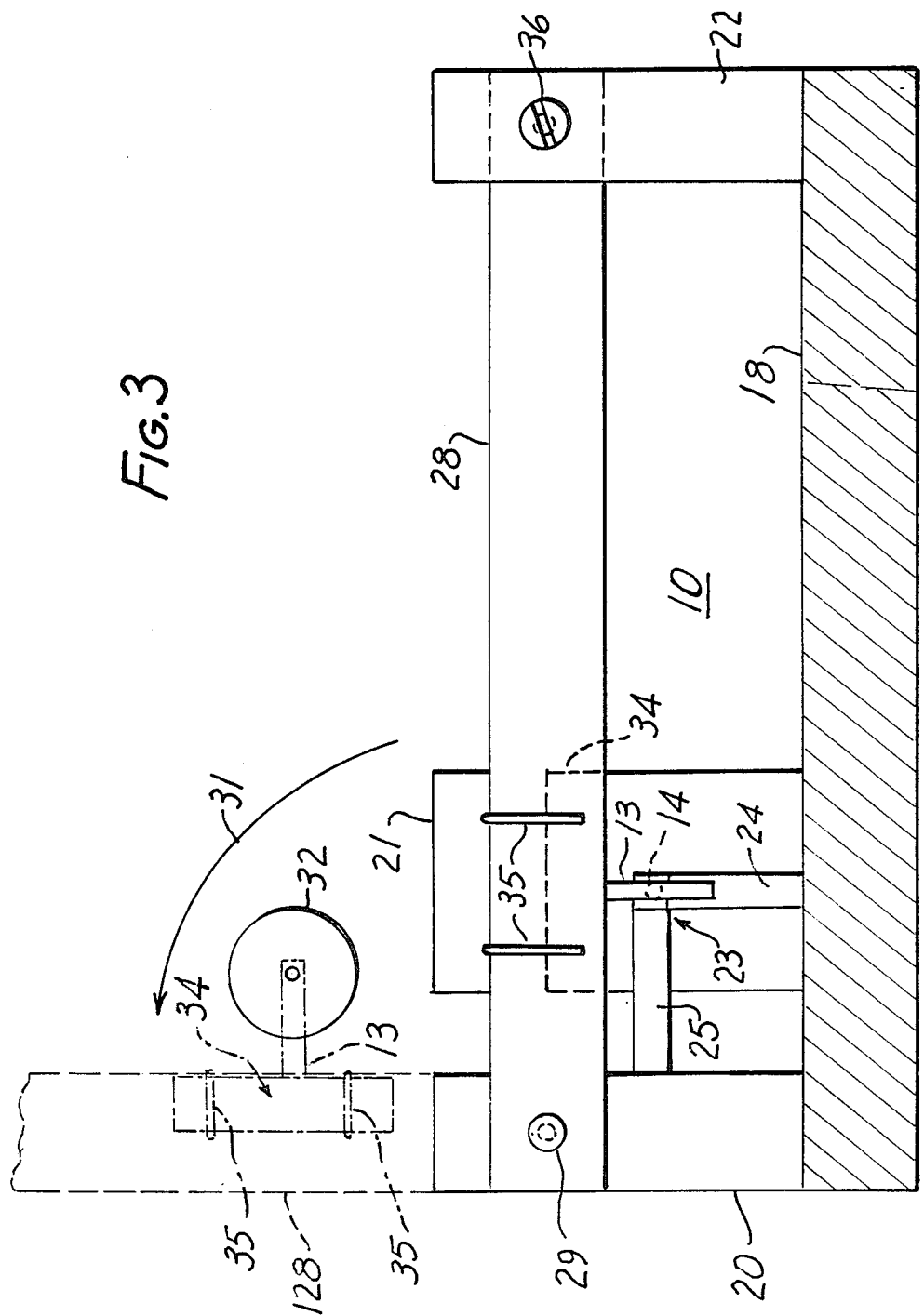
FIG. 3 is a view taken on the line 3—3 in FIG. 1.

In this respect, the assembly shown in FIGS. 1, 2 and 3, or part thereof including the sample, sample support and tip, may be located in an oven or other container to provide any desired temperature, vacuum or gas environment for the process.

A change in susceptibility of the sample 12 as a function of temperature variation or other changing environment may thus be determined with the varying tunneling current 15. By way of example, measurable susceptibility could be increased by subjecting the sample 12 and the elastic support 13 to a decrease in temperature.

As indicated in FIG. 1 by the auxiliary beam 133, the material depositing apparatus 32 or another agency may be employed to pretreat the support 13 by deposition of a substance thereon, prior to deposition of the sample 12. By way of example, provision of the sample 12 may include pretreating the elastic support with a thin-film-forming organic substance 133. Within the scope of the subject invention, the organic film itself could be subject to the susceptibility study effected with the aid of the tunneling current 15. In this manner, conductive polymers and organic or biological films, such as those including transition metals, may be analyzed and studied.

Figure 7:
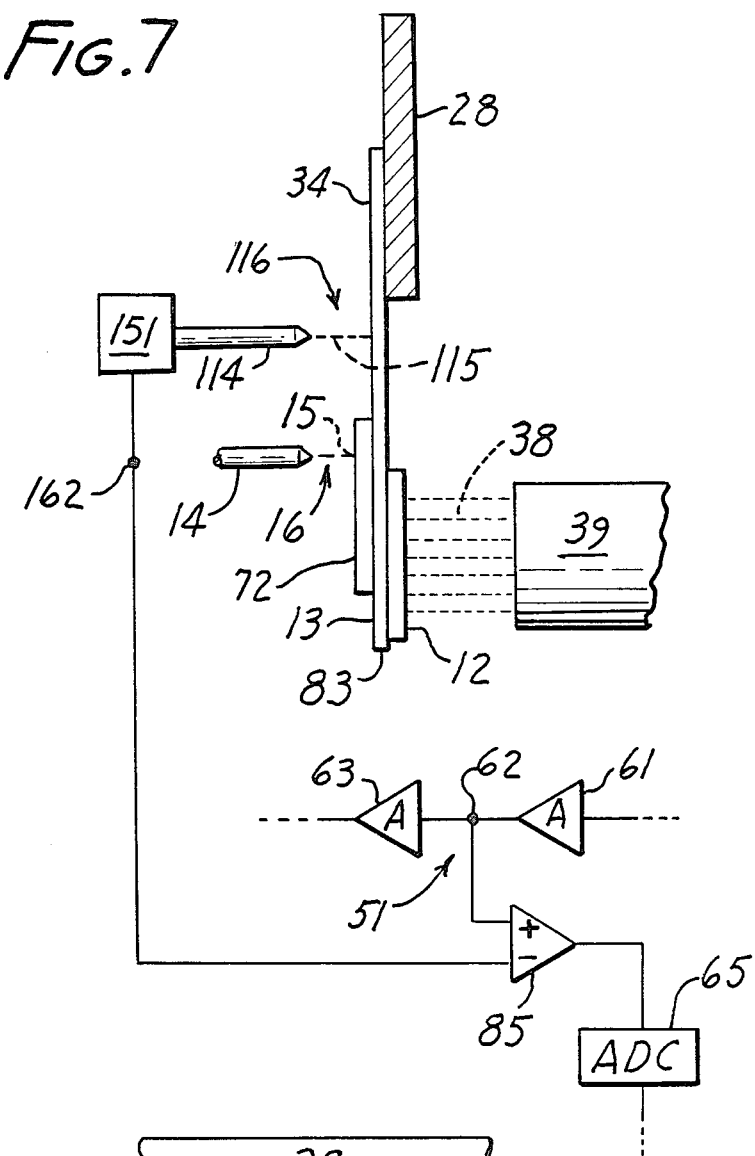
FIG. 7 is a section through part of an apparatus of the type shown in FIGS. 1 to 3, showing further modifications, as well as an auxiliary circuit, according to embodiments of the invention.

Alternatively, a film of high work function material, such as tungsten or a semiconductor, may be deposited on the sample 12 or, as shown at 72 in FIG. 7, preferably on the sample support or beam 13, such as for the purpose of increasing or otherwise altering a work function with respect to the tunneling current or gap. Sensitivity of measurement may be increased by increasing at the gap 16 an exponential dropoff of tunneling current 15 as a function of gap increase.

It is well known, such as from the above mentioned articles of Benfield et al and Pronk et al, that many metal clusters exhibit a rich spectrum of magnetic properties. The subject invention enables, for example, a comparison of properties of such clusters, when placed on surfaces, to their gas phase properties.

Susceptibility measurements as a function of surface area or bulk are also feasible within the scope of the subject invention. For instance, if a sample is of a material having a bulk value of magnetic susceptibility, the sample 12 may be provided on the elastic support 13 in the form of a deposit of that material having a magnetic susceptibility different from bulk value. A magnetic field 38 may then be applied to such deposit to vary the gap 16 and effect corresponding tunneling current variations, and the latter different magnetic susceptibility is determined in response to the latter tunneling current variations. The deposit on the sample 12 is then increased, such as with the apparatus 32 or material beam 33, and magnetic susceptibility determination is repeated with the aid of the servo loop 51 and apparatus 66 and 68, until magnetic susceptibility determined in response to tunneling current value at the increased deposit is equal to the bulk value. The size of the latter increased deposit may then be determined for comparison, such as with the aid of a gauge or other high-precision measurement device.

In this respect, many crystal substances may be grown layer-by-layer by evaporation techniques. By measuring the susceptibility after the deposition of each layer, the point at which susceptibility attains bulk value could be determined. The susceptibility of the surface alone could be determined by doing area versus volume susceptibility measurements. This information is of interest, since all surfaces have broken bonds. The degree to which the electrons re-pair via surface reconstruction may be explored by tunneling susceptometry according to the subject invention.

As already mentioned above with the aid of position 139 in FIGS. 2 and 4, adsorbate or other susceptibility may be studied as a function of field orientation with the apparatus and methods of the subject invention. A vast amount of information on the bonding of atoms, molecules and clusters to surfaces may thus be obtained.

Since part of the usual paramagnetic susceptibility formula is a Boltzmann distribution due to thermally random orientation, an unusually high directional susceptibility for surface systems due to the ordering effect of bonding to the surfaces may be expected. Also, by studying susceptibility as a function of field strength, surface binding energy may be explored. A threshold of field strength at which adsorbates suddenly align with the field may be observed.

By ramping the magnetic field strength, such as with the aid of a component of the type symbolized at 42 in FIG. 1 and observing the displacement of the sample support 13 as a function of the field, such as with the apparatus 51, 66 and 68 shown in FIG. 4, one can study applicability of the de Haas—van Alphen effect to a sample as a means of exploring the Fermi surface of the sample 12 by observing changes in the magnetic susceptibility with changing magnetic field strength. Reference may in this respect be had to the above mentioned Chambers article.

For the operation of the servo loop 51, only the piezo leg 26 or Z-adjustment is required, and many investigations and measurements within the scope of the subject invention may be conducted with that one type of adjustment. However, for broader research and sophisticated investigations, an X-Y-Z adjustment is generally required according to a preferred embodiment of the subject invention. Alternatively, the kind of tube scanner disclosed by Drs. Binnig and Smith in their above mentioned article may be employed.

In this respect, the preferred embodiment shown in FIG. 4 provides scanning circuitry 73 for that purpose. Such scanning circuitry typically includes a function generator 74 which may be of a conventional type as developed in the past for scanning purposes or which may in effect be part of the computer and program used at 66.

The function generator 75 drives the piezo legs 24 and 25 through high voltage amplifiers 75 and 76. Offset voltages or offsets 78 and 79 may be provided for biasing the X-Y piezo legs appropriately.

A lead 81 in FIG. 4 indicates control of the function generator 74 by the computer 66 or the incorporation of that function into the computer and its software. A scanning operation of the tip 14 relative to the sample 12 may thus be initiated and terminated in a predetermined or controlled manner.

Also, the gap 16 may be scanned laterally in this manner for different features of the sample surface. The computer control may also be employed to move the tip 14 via circuitry 73 to specific locations on the sample 12. Investigations may thus be conducted at favorable work function locations.

The apparatus herein disclosed may employ principles of the atomic force microscope disclosed in the above mentioned article of that name by Binnig and Quate, such as for purposes of investigating surfaces of insulators. In the experimental setup shown in FIG. 2 of that atomic force microscope article, the diamond tip may be removed and, according to the subject invention, a layer of paramagnetic material or other sample 12 deposited on the surface of the cantilever. After obtaining a steady state value for the tip-surface separation with drift calibration, a magnetic or other field is applied, such as with the field generator 39. The displacement of the cantilever or elastic sample support 13 is then measured by the tip displacement and converted to a force using the elastic constant of the cantilever or sample support material. On the basis of a knowledge of the amount of material deposited as the sample 12, the magnetic or other susceptibility of the sample material is readily determined, depending on the nature of the applied field. This applies also to the embodiments shown in the drawings hereof.

Sensitivity of the apparatus may be improved by coating the sample 12 with a material of high work function leading to a quicker exponential dropoff of the tunneling current with increases in the tunneling gap 16.

Figure 5:
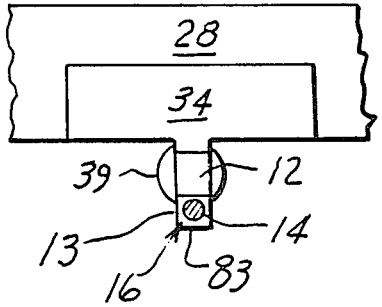
FIG. 5 is a detail view, similar to part of FIG. 2, showing a modification according to a preferred embodiment of the invention.

In practice the sample 12 need not be located between the sample carrier and the tunneling tip. Rather, the gap 16 may be provided at the location spaced laterally from the sample 12 on the elastic support 13. In this respect, FIG. 5 shows an arrangement where the tip 14 and thereby the tunneling gap 16 is laterally-offset from the sample 12. Tunneling currents thus need not proceed through any part of the sample. Clips 35 or other fasteners may again be employed, though not shown in FIGS. 5 et seq., in order to avoid clutter.

The sample support may be in the form of an elastic beam, as already shown at 13 in FIGS. 2, 3, 5 et seq., and the sample is provided on that elastic beam. The electric tunneling current, symbolically shown at 15 in FIGS. 1 and 4, is provided in a gap 16 between the electrode or tip 14 and that elastic beam 13. The magnetic or other field 38 is applied to the sample, including its surface, on that elastic beam to vary the gap 16 and effect corresponding tunneling current variations for determining susceptibility of the sample to the applied field.

According to FIG. 5 and equivalents thereof, sensitivity of measurement is increased by providing the gap 16 closer to a free end of the beam 18 than to a fixed end thereof where the projecting beam merges with the bulk of the sample carrier 34. The arrangement shown in FIG. 5 may be employed in the apparatus of FIGS. 1 to 4.

Figure 6:
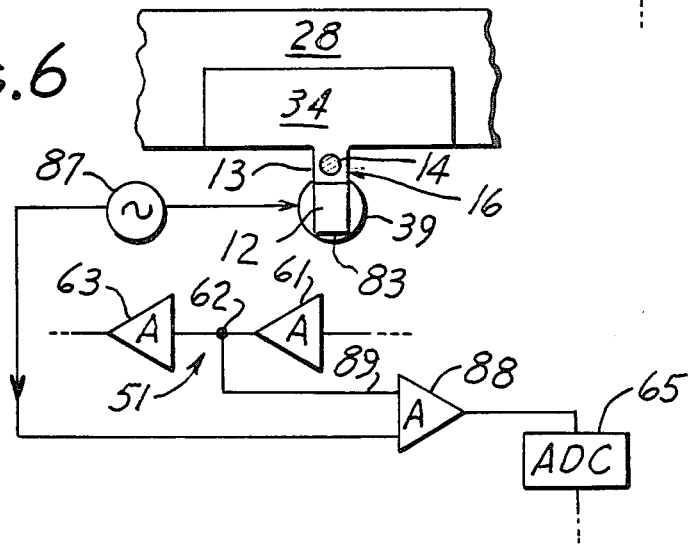
FIG. 6 is a view similar to FIG. 5, showing another modification and also modulating circuitry according to an embodiment of the invention.

The same applies to the arrangement shown in FIG. 6, according to which the sample 12 is provided on a part of the beam 13 spaced from a fixed end of that beam at the bulk of the sample carrier 13.

Stability of measurement against external vibrations may be increased by providing the gap 16 at the tunneling tip 14 closer to that fixed end than the sample, which may be located near a free end 83 of the sample carrier or beam 13.

For a tradeoff of stability and sensitivity, the gap 16 may be rendered adjustable in location between the fixed end at 28 or 34 and the free end 83 of the sample carrying beam 13. Such adjustability of the location of the tunneling current may be achieved by an appropriate control of the circuitry 73. For instance, offsets 78 and 79 may be employed for that purpose.

FIGS. 5 and 6 are representative of an embodiment of the invention according to which the tunneling gap 16 is provided at the location spaced laterally from the sample 12 on the elastic beam 13. That also applies to the embodiment shown in FIG. 7.

In particular, according to FIG. 7 the sample 12 is provided on a first side of the elastic beam or sample carrier 13, and the tunneling gap 16 is provided at an opposite second side of that elastic beam. This further reduces possible interference between sample 12 and tunneling current 15. As already mentioned above, a film 72 of high work function material may be deposited on the sample support or beam 13. Such a film may also be deposited at the location of the tunneling gap 16 in the embodiments of FIGS. 5 and 6. Alternatively, the film 72 may be omitted from the embodiment of FIG. 7, when the work function of the material of the elastic support or beam 13 is satisfactory per se. However, a higher work function at the tunneling gap 16 would increase sensitivity of measurement by increasing an exponential dropoff of tunneling current 15 as a function of gap increase.

FIG. 7 also illustrates an embodiment providing a second gap 116 between the elastic support or beam 13 and a second electrode 114. This second electrode is energized and controlled in position by a circuit 151 which, in effect, may a duplicate of the servo circuit shown in FIG. 4. Accordingly, a second tunneling current 115 is established between the second electrode or tip 114 and the elastic support or beam 13, in addition to the first tunneling current 15 in the gap 16. The circuitry shown in FIG. 7 employs the second tunneling current 115 through the second gap 116. for correcting effects of externally imposed vibration. In FIG. 7, an equivalent of the junction 62 shown in FIG. 4 for the servo loop 51 is shown as a terminal 162 for the second servo loop 151.

Vibrations of the structure including supports 13, 28 and 34, such as induced by building vibrations or other disturbances, will affect both tunneling currents 15 and 115 identically for all practical purposes. Accordingly, like signal disturbances or error signals will occur at the junction 62 of the first servo loop 51 and at the corresponding junction or terminal 162 of the auxiliary servo loop 151. A differential amplifier 5 or an equivalent circuit component employs the error signal appearing at the terminal 162 to remove the error signal occurring in the useful servo loop signal derived from the junction 62 of the main servo loop 51.

The output of the operational amplifier 85 is connected to the analog to digital converter 65 which, in turn, is connected to the computer and data storage facility 66 shown and described in connection with FIG. 4. The susceptibility-indicative signal, cleansed of error signals, may thus be recorded, displayed or otherwise processed at 68. In practice, the second electrode 114 and circuit 151 may be employed for effecting double measurements.

It is to be understood that the position of tip 14 according to FIG. 7 may be employed when no higher work function material 72 and/or no second electrode 114 is being used.

According to an embodiment of the subject invention, sensitivity of measurement is increased by imposing a modulation on the tunneling current. By way of example, reference may be had to the above mentioned Dürig et al article, which shows spectra of tunnel current and experimental and calculated resonance frequencies of cantilever beams similar to the elastic support or beam 13 for various positions of the tunnel tip. By modulating the tunneling current 15 at a frequency well above feedback response frequency, it is possible to measure sub-Angstrom variations of the gap 16.

The desired modulation may be imposed on the field 38, and such modulation may be employed in determining susceptibility of the sample 12 in response to the tunneling current variations 15. FIG. 6 shows apparatus for implementing such a method according to an embodiment of the subject invention into effect.

In particular, the field generator 39 is energized in FIG. 6 from a high-frequency current source which also applies its output signal to an input of a lock-in amplifier 88. Such energization of the field generator 39 correspondingly modulates the magnetic or other field 38 to which the sample 12 is subjected. In consequence, a corresponding modulation appears in the tunneling current 15 and, therefore, in the signal occurring at the junction 62 of the servo loop 51 shown in FIG. 4. That signal is applied to the lock-in amplifier 88 which locks in on that modulation, as received from the source 87, and applies to the analog to digital converter 65 and hence to the computer data storage a signal indicative of displacements of the sample 12 and elastic support 13 essentially due only to the magnetic field.

The embodiments shown in FIGS. 5, 6 and 7 or any part thereof may be employed in the apparatus shown in FIGS. 1 to 4 and in equivalents thereof.

Calibration of the instrument for various experimental procedures may, for example, be effected by measuring the deflection of the beam or elastic support 13 without an applied sample 12.

A superconductor may be employed at the field generator 39 for providing a high magnetic field conveniently.

Moreover, the subject extensive disclosure will render apparent or suggest to those skilled in the art various modifications and variations within the spirit and scope of the invention.

I claim:

1. A method of determining magnetic susceptibility at a surface of a sample, comprising in combination the steps of:
    providing said sample on an elastic support;
    providing an electric tunneling current through a gap between an electrode and said elastic support;
    varying said gap with a magnetic field applied to said surface and sample on said elastic support to effect a corresponding variation in an electrical property of said gap; and
    determining magnetic susceptibility of said sample in response to said variation in said electrical property.

2. A method as claimed in claim 1, including the steps of:
    depositing said sample as a thin film sample on said elastic support;
    applying said magnetic field to said thin film sample to effect said corresponding variation in said electrical property; and
    determining magnetic susceptibility of said thin film sample in response to the latter variation in said electrical property.

3. A method as claimed in claim 1, including the steps of:
    subjecting said applied magnetic field to variation thereby varying said gap and said electrical property; and
    determining a change in magnetic susceptibility of said sample as a function of said magnetic field variation with said varying electrical property.

4. A method as claimed in claim 1, wherein:
    said sample is of a material having a bulk value of magnetic susceptibility;
    said sample is provided on said elastic support in the form of a deposit of said material having a magnetic susceptibility different from said bulk value;
    said magnetic field is applied to said deposit to vary said gap and effect corresponding variation in said electrical property;
    said different magnetic susceptibility is determined in response to the latter variation in said electrical property;
    said deposit is increased and the latter determination is repeated until magnetic susceptibility determined in response to a value of said electrical property at said increased deposit is equal to said bulk value; and
    a size of the latter increased deposit is determined for comparison.

5. A method as claimed in claim 1, including the step of:
    determining magnetic susceptibility as a function of magnetic field orientation by applying said magnetic field to said sample at different orientations to said surface for variation of said gap and corresponding individual variation of said electrical property at each field orientation for a detection of anisotropies in magnetic susceptibility.

6. A method as claimed in claim 1, including the steps of:
    subjecting said sample to temperature variation to vary said electrical property of said gap; and
    determining a change in magnetic susceptibility of said sample as a function of said temperature variation with the varying electrical property of said gap.

7. A method as claimed in claim 1, including the step of:
   increasing measurable susceptibility by subjecting said sample and elastic support to a decrease in temperature.

8. A method as claimed in claim 1, including the step of:
   providing said sample by treating said elastic support with a thin-film-forming organic substance.

9. A method as claimed in claim 1, wherein:
   said gap is provided at a location spaced laterally from the sample on said elastic support.

10. A method as claimed in claim 1, wherein:
    said gap is provided on a side of the elastic support spaced from the side on which the sample is provided.

11. A method as claimed in claim 1, including the step of:
    increasing sensitivity of measurement by increasing at said gap an exponential dropoff of a value of said electrical property as a function of gap variation.

12. A method as claimed in claim 1, including the steps of:
    providing a second gap between said elastic support and a second electrode; and
    employing a second tunneling current through said second gap for correcting effects of externally imposed vibration.

13. A method as claimed in claim 1, including the step of:
    scanning said gap laterally for different features of said surface.

14. A method as claimed in claim 1, including the step of:
    increasing sensitivity of measurement by imposing a modulation on the tunneling current.

15. A method as claimed in claim 1, including the steps of:
    imposing a modulation on said field; and
    employing said modulation in determining susceptibility of said sample in response to said variation in said electrical property.

16. A method as claimed in claim 1, wherein:
    said elastic support is provided in the form of an elastic beam;
    said sample is provided on said elastic beam;
    said electric tunneling current is provided in a gap between said electrode and said elastic beam; and
    said magnetic field is applied to said surface and sample on said elastic beam to vary the latter gap and effect corresponding variations in said electrical property for determining magnetic susceptibility of said sample.

17. A method as claimed in claim 16, wherein:
    said beam is supported on a pivoted lever.

18. A method as claimed in claim 16, including the step of:
    increasing stability of measurement against external vibrations by providing said gap closer to a fixed end of said beam than said sample.

19. A method as claimed in claim 16, including the step of:
    increasing sensitivity of measurement by providing said gap closer to a free end of said beam than to a fixed end thereof.

20. A method as claimed in claim 16, including the step of:
    rendering said gap adjustable in location between a fixed end and a free end of said beam.

21. A method as claimed in claim 16, wherein:
    said gap is provided at a location spaced laterally from the sample on said elastic beam.

22. A method as claimed in claim 16, wherein:
    said sample is provided on a first side of the elastic beam; and
    said gap is provided at an opposite second side of the elastic beam.

23. A method of determining susceptibility of a material to a field exerting a force through space, comprising in combination the steps of:
    providing a sample of said material on an elastic support;
    providing an electric tunneling current through a gap between an electrode and said elastic support;
    varying said gap with a force of a field applied to said sample on said elastic support to effect a corresponding variation in an electrical property of said gap; and
    determining susceptibility of said sample to said field in response to said variation in said electrical property.

24. A method as claimed in claim 23, including the steps of:
    depositing said sample as a thin film sample on said elastic support;
    applying said field to said thin film sample to effect said corresponding variation in said electrical property; and
    determining susceptibility of said thin film sample to said field in response to the latter variation in said electrical property.

25. A method as claimed in claim 23, including the steps of:
    subjecting said applied field to variation thereby varying said gap and said electrical property; and
    determining a change in susceptibility of said sample as a function of said field variation with said varying electrical property.

26. A method as claimed in claim 23, including the step of:
    determining susceptibility as a function of field orientation by applying said field to said sample at different orientations to said surface for variation of said gap and corresponding individual variation of said electrical property at each field orientation for a detection of anisotropies in susceptibility.

27. A method as claimed in claim 23, including the steps of:
    subjecting said sample to temperature variation to vary said electrical property of said gap; and
    determining a change in susceptibility of said sample as a function of said temperature variation with the varying electrical property of said gap.

28. A method as claimed in claim 23, including the step of:
    increasing measurable susceptibility by subjecting said sample and elastic support to a decrease in temperature.

29. A method as claimed in claim 23, including the step of:
    providing said sample by treating said elastic support with a thin-film-forming organic substance.

30. A method as claimed in claim 23, wherein:
    said gap is provided at a location spaced laterally from the sample on said elastic support.

31. A method as claimed in claim 23, wherein:
said gap is provided on a side of the elastic support spaced from the side on which the sample is provided.

32. A method as claimed in claim 23, including the steps of:
providing a second gap between said elastic support and a second electrode; and
employing a second tunneling current through said second gap for correcting effects of externally imposed vibration.

33. A method as claimed in claim 23, including the step of:
scanning said electrode laterally relative to the sample.

34. A method as claimed in claim 23, including the step of:
increasing sensitivity of measurement by imposing a modulation on the tunneling current.

35. A method as claimed in claim 23, including the step of:
imposing a modulation on said field; and
employing said modulation in determining susceptibility of said sample in response to said variation in said electrical property.

36. A method as claimed in claim 23, wherein:
said elastic support is provided in the form of an elastic beam;
said sample is provided on said elastic beam;
said electric tunneling current is provided in a gap between said electrode and said elastic beam; and
said field is applied to said sample on said elastic beam to vary the latter gap and effect corresponding variations in said electrical property for determining susceptibility of said sample to said field.

37. A method as claimed in claim 36, wherein:
said beam is supported on a pivoted lever.

38. A method as claimed in claim 36, including the step of:
increasing stability of measurement against external vibrations by providing said gap closer to a fixed end of said beam than said sample.

39. A method as claimed in claim 36, including the step of:
increasing sensitivity of measurement by providing said gap closer to a free end of said beam than to a fixed end thereof.

40. A method as claimed in claim 36, including the step of:
rendering said gap adjustable in location between a fixed end and a free end of said beam.

41. A method as claimed in claim 36,
said gap is provided at a location spaced laterally from the sample on said elastic beam.

42. A method as claimed in claim 36, wherein:
said sample is provided on a first side of the elastic beam; and
said gap is provided at an opposite second side of the elastic beam.

43. In apparatus for determining susceptibility of a material to a field, the improvement comprising in combination:
an elastic support for a sample of said material;
means including an electrode for providing an electric tunneling current through a gap between said electrode and said elastic support; and
means for enabling determination of susceptibility of said sample in response to variations of an electrical property of said gap, including means for varying said gap, having means for applying a field to said sample on said elastic support to effect corresponding variations of said electrical property.

44. Apparatus as claimed in claim 43, including:
means for subjecting said applied field to variation thereby varying said gap and said electrical property;
said determination enabling means including means for determining a change in susceptibility of said sample as a function of said field variation with said varying electrical property.

45. Apparatus as claimed in claim 43, including:
means including a second electrode for providing a second gap between said elastic support and said second electrode; and
means employing a second tunneling current through said second gap for double measurement.

46. Apparatus as claimed in claim 43, including:
means for scanning said electrode laterally relative to said sample.

47. Apparatus as claimed in claim 43, including:
means for imposing a modulation on the tunneling current.

48. Apparatus as claimed in claim 43, including:
means for imposing a modulation on said field; and
means for employing said modulation in determining susceptibility of said sample in response to said variations of said electrical property.

49. Apparatus as claimed in claim 43, including:
means for subjecting said sample to temperature variation to vary said electrical property of said gap.

50. Apparatus as claimed in claim 43, wherein:
said means including an electrode include means for positioning said electrode for said gap at a location spaced laterally from the sample on said elastic support.

51. Apparatus as claimed in claim 43,
said means including an electrode include means for positioning said electrode for said gap on a side of the elastic support spaced from the side on which the sample is located.

52. Apparatus as claimed in claim 43, wherein:
said elastic support is in the form of an elastic beam carrying said sample;
said means for providing said electric tunneling current include means for providing said electric tunneling current in a gap between said electrode and said elastic beam; and
said means for enabling determination include means for applying said field to said sample on said elastic beam to vary the latter gap and effect corresponding variations of said electrical property for determining susceptibility of said sample.

53. Apparatus as claimed in claim 52, including:
means for rendering said gap adjustable in location between a fixed end and a free end of said beam.

54. Apparatus as claimed in 43, wherein:
said elastic support is in the form of an elastic beam having a fixed end and carrying said sample;
said means for providing said electric tunneling current through said gap include means for providing said gap between said electrode and said elastic beam closer to said fixed end than said sample; and
said means for enabling determination include means for applying said field to said sample on said elastic beam to vary the latter gap and effect corresponding variations of said electrical property for determining susceptibility of said sample.

55. Apparatus as claimed in claim 43, wherein:

said elastic support is in the form of an elastic beam carrying said sample and having a free end and a fixed end;

said means for providing said electric tunneling current through said gap include means for providing said gap between said electrode and said elastic beam closer to said free end than to said fixed end of said beam; and said means for enabling determination include means for applying said field to said sample on said elastic beam to vary the latter gap and effect corresponding variations of said electrical property for determining susceptibility of said sample.

56. Apparatus as claimed in claim 43, wherein:

said elastic support is in the form of an elastic beam carrying said sample on a first side of that elastic beam; and said means for providing said electric tunneling current through said gap include means for providing said gap between said electrode and said elastic beam at an opposite second side of the elastic beam; and said means for enabling determination include means for applying said field to said sample on said elastic beam to vary the latter gap and effect corresponding variations of said electrical property for determining susceptibility of said sample.

* * * * *